(12) United States Patent
Stoler et al.

(10) Patent No.: US 10,044,456 B1
(45) Date of Patent: *Aug. 7, 2018

(54) CLOCK GENERATION WITH NON-INTEGER CLOCK DIVIDING RATIO

(71) Applicant: Amazon Technologies, Inc., Seattle, WA (US)

(72) Inventors: Gil Stoler, Nofit (IL); Yaniv Shapira, Bet Itzhak (IL)

(73) Assignee: Amazon Technologies, Inc., Seattle, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/489,583

(22) Filed: Apr. 17, 2017

Related U.S. Application Data

(63) Continuation of application No. 14/745,025, filed on Jun. 19, 2015, now Pat. No. 9,628,211.

(51) Int. Cl.
*H04J 3/06* (2006.01)
*G06F 1/12* (2006.01)
*G06F 1/06* (2006.01)

(52) U.S. Cl.
CPC ............. *H04J 3/0691* (2013.01); *G06F 1/06* (2013.01); *G06F 1/12* (2013.01); *H04J 3/0635* (2013.01); *H04J 3/0658* (2013.01); *H04J 3/0697* (2013.01)

(58) Field of Classification Search
None
See application file for complete search history.

(56) References Cited

U.S. PATENT DOCUMENTS

| 6,754,295 | B1 | 6/2004 | Hartnett | |
|---|---|---|---|---|
| 6,823,032 | B1 | 11/2004 | Bening et al. | |
| 8,081,017 | B2 | 12/2011 | Shibayama et al. | |
| 8,861,669 | B2 | 10/2014 | Zhang et al. | |
| 9,628,211 | B1 | 4/2017 | Stoler et al. | |
| 2002/0023239 | A1* | 2/2002 | Nomura | H03L 7/183 713/500 |
| 2007/0025491 | A1 | 2/2007 | Jeong | |
| 2008/0106446 | A1 | 5/2008 | Lee | |
| 2008/0231254 | A1* | 9/2008 | Kanoh | G01R 23/163 324/76.19 |
| 2010/0232558 | A1 | 9/2010 | Terada et al. | |

(Continued)

OTHER PUBLICATIONS

U.S. Appl. No. 14/745,025, "Notice of Allowance", Dec. 27, 2016, 9 pages.

*Primary Examiner* — Otis L Thompson, Jr.
(74) *Attorney, Agent, or Firm* — Kilpatrick Townsend & Stockton LLP

(57) ABSTRACT

A clock generator for generating a target clock with a frequency equal to the frequency of an input clock divided by a non-integer ratio is disclosed. The clock generator comprises a clock divider. The clock divider is configured to divide the input clock by a first dividing ratio during a first portion of a frame period to generate a first clock slower than the target clock, and divide the input clock by a second dividing ratio during a second portion of the frame period to generate a second clock faster than the target clock. A difference between the first dividing ratio and the second dividing ratio is 0.5 or 1. In some embodiments, the first dividing ratio and the second dividing ration are integers closest to the non-integer ratio.

20 Claims, 15 Drawing Sheets

(56) References Cited

U.S. PATENT DOCUMENTS

2012/0051477 A1* 3/2012 Lawange ................ H04J 3/076
                                                              375/371
2012/0126867 A1   5/2012  Bae et al.
2012/0306419 A1  12/2012  Suzuki
2014/0286357 A1   9/2014  Shenoi et al.

* cited by examiner

| Parameter | Value | Corresponding Period |
|---|---|---|
| Slot Number | 128 | |
| Slot Width | 8 bits | |
| SBCLK | 500 MHz | 2 nSec |
| Frame | 8 KHz | 125 uSec |
| PCM Ideal | 8192 KHz | 122.0703125 nSec |
| PCM Div Exact | 61.03515625 | |
| PCM Div | 61 | |
| PCM Round Direction | DOWN | |
| PCM base | 8196.721 KHz | 122 nSec |
| PCM Div+ | 62 | |
| PCM tune | 8064.516 KHz | 124 nSec |
| PCM CntTotal | 1024 cycles | |
| PCM CntBase | 988 cycles | |
| PCM CntTune | 36 cycles | |
| Total Time on frame | 125 uSec | |
| Delta on Frame | 0 nSec | |

FIG. 6

| Parameter | Value | Corresponding Period |
|---|---|---|
| Slot Number | 128 | |
| Slot Width | 8 bits | |
| SoC Clock | 428.571 MHz | 2.3333357 nSec |
| Frame | 8 KHz | 125 µSec |
| PCM Ideal | 8192 KHz | 122.0703125 nSec |
| PCM Div Exact | 52.3157959 | |
| PCM Div | 52 | |
| PCM Round Direction | DOWN | |
| PCM base | 8241.75 KHz | 121.3334547 nSec |
| PCM Div+ | 53 | |
| PCM tune | 8086.245 KHz | 123.6667903 nSec |
| PCM CntTotal | 1024 | |
| PCM CntBase | 701 | |
| PCM CntTune | 323 | |
| Total Time on frame | 124.999124999125 µSec | |
| Delta on Frame | -0.875000875 nSec | |

FIG. 7

CLOCK GENERATION WITH NON-INTEGER CLOCK DIVIDING RATIO

CROSS REFERENCE TO RELATED APPLICATIONS

This application is a continuation of U.S. application Ser. No. 14/745,025, filed Jun. 19, 2015, and titled "CLOCK GENERATION WITH NON-INTEGER CLOCK DIVIDING RATIO," the content of which is herein incorporated in its entirety for all purposes.

BACKGROUND

Many data communications use specific clock frequencies. For example, time domain multiplexing/pulse code modulation (TDM/PCM) audio interface protocols typically use an 8.192 MHz PCM clock for an audio sampling rate of 8 KHz. The specific frequency is usually served by dividing an external crystal oscillator of a particular frequency by an integer number using a clock divider. For example, in TDM/PCM, input from an external crystal oscillator with a frequency of 49.152 MHz is divided by 6 in a device supporting the protocol to generate the 8.192 MHz PCM clock. However, the extra crystal oscillator and other components supporting the crystal oscillator may increase the cost and the size of the circuit board. Furthermore, in a system where a clock of a specific frequency needs to be synchronized with other clock sources, additional circuits may be needed to synchronize the oscillator.

It is thus desirable to derive a target clock with a specific frequency from other clock sources that have been used in the system already. However, in many cases, to generate the target clock with the desired frequency from existing clock sources used in the system, a non-integer dividing ratio may be required, which may be difficult or costly to implement.

BRIEF DESCRIPTION OF THE DRAWINGS

Various embodiments in accordance with the present disclosure will be described with reference to the drawings, in which:

FIG. 6 illustrates an example of generating a target clock by effectively dividing an input clock by a non-integer number, where no drift is accumulated in a frame;

FIG. 7 illustrates an example of generating a target clock by effectively dividing an input clock by a non-integer number, where non-zero drift is accumulated in a frame;

DETAILED DESCRIPTION

Figure 1:
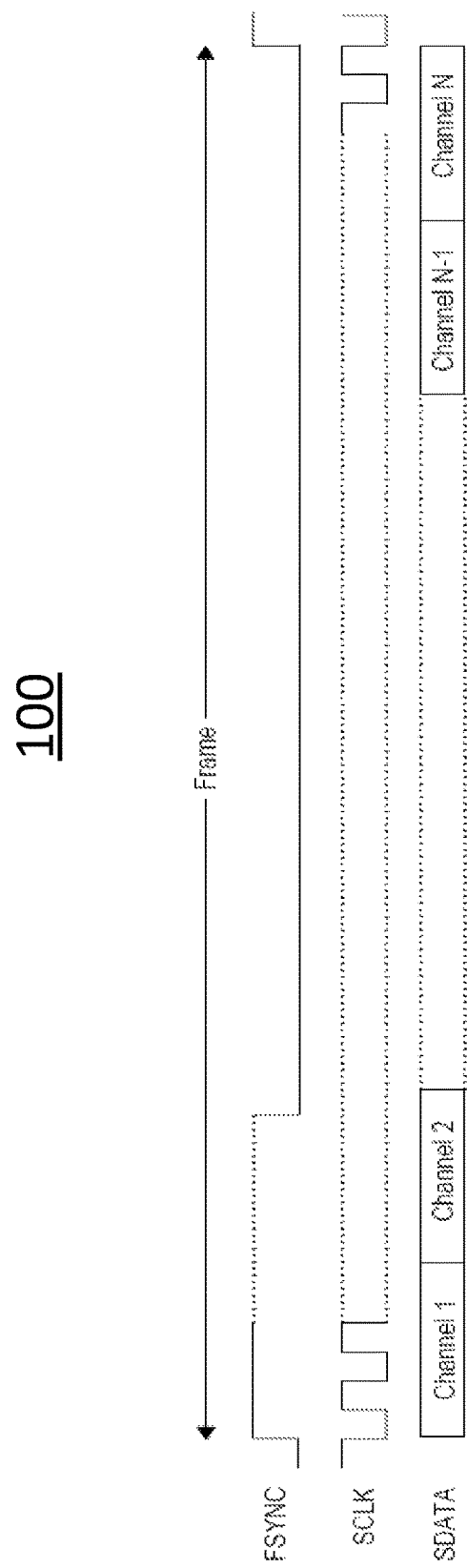
FIG. 1 illustrates an example timing diagram of digital data communication using time division multiplexing (TDM)

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Techniques are described herein for generating a target clock with a specific desired frequency using an existing clock source in a system, where the ratio between frequencies of the clock source and the target clock is neither an integer nor a half of an integer. A logical flow that can be implemented in hardware is described, wherein the existing clock source is divided by two or more integer values or half-of-an-integer values during a time frame to generate a clock equivalent to the target clock with the specific desired frequency. In some embodiments of the present disclosure, an adaptive flow capable of generating any target frequency from any source clock by dynamically monitoring and tuning the operation of a clock divider is described, provided that the frequency of the source clock is higher than the target frequency, and that the cycle time of the source clock is less than the time interval error (TIE) specification of the target clock. Time interval error (TIE) of a clock edge is generally defined as the time deviation of that clock edge from its ideal position measured from a reference point.

I. Timing Constraints of Desired Clocks

Timing specification is important in high speed integrated circuits. For at least this reason, many data communications use strict clock frequencies with low clock jitters. For synchronized circuits where multiple clock domains exist, the relationship between the frequencies and phases of different clock domains that interact with one another are also important for the circuits to function as desired.

For example, many audio data communications between integrated circuits use time domain multiplexing/pulse code modulation (TDM/PCM) audio interface protocols, which typically use a 8.192 MHz PCM clock for an audio sampling rate of 8 KHz. The TDM/PCM interface protocols may also include other communication standards at various frequencies, such as, for example, serial peripheral interface (SPI), SPI compatible microprocessor interface (MPI), or Zarlink serial interface (ZSI) that merges TDM/PCM with SPI, for passing control and status signals. Furthermore, a system employing these protocols may use other clock frequencies for other parts of the system, such as a system bus clock or a system-on-chip (SoC) clock. Thus, it is challenging to design a clock system for TDM/PCM applications that can meet the performance requirements, while keeping the cost down.

The present disclosure describes some timing constraints in designing a clock system, and methods to meet the timing constraints, using TDM/PCM with SPI, MPI, or ZSI interface protocol for audio data communication between devices (e.g., a master device and a slave device) as examples, to help a skilled person to fully understand the disclosure and teachings provided herein. It should be appreciated that the methods or circuits described in the present disclosure may be used to generate a clock at any specific frequency using a faster reference clock for various applications, in addition to the specific examples described herein.

1. Time Domain Multiplexing (TDM)

Transferring multiple channels of digital audio data within an audio product or between different audio devices can be a challenge. The industry has adopted a time division multiplexed (TDM) interface that allows multiple channels of data to be transmitted on a single data line. TDM interface has become a common mechanism for transferring multiple channels of audio data between circuits or devices within a system.

FIG. 1 illustrates an example timing diagram 100 of digital data communication using TDM. TDM interface generally comprises two control clocks and a serial audio data line SDATA. The two control clocks include a frame synchronization pulse FSYNC and a serial clock SCLK. One function of the FSYNC pulse is to identify the beginning of an audio data frame, which is typically indicated by the rising edge of the FSYNC pulse as illustrated in FIG. 1. A frame rate of the FSYNC pulse is typically at the audio sample rate, such as 8 KHz. Thus, an audio data frame typically includes one audio sample from each multiplexed channel. Today, some audio sample rates, such as the sample rate for a cellular phone call or some other legacy applications, are still limited to 8 KHz due to backward compatibility requirement.

As shown in FIG. 1, serial audio data SDATA comprises data from a plurality of channels. Each frame of SDATA includes one audio sample from each channel of the plurality of channels. Serial clock SCLK is used to shift serial audio data SDATA into or out of serial audio ports. Thus, the frequency of SCLK and the data rate of SDATA are directly proportional to the audio sample rate, the number of multiplexed channel blocks within a frame, and the bit-width of each channel block.

2. Pulse Code Modulation (PCM)

Pulse code modulation (PCM) is a method used to digitally represent sampled analog signals. It is the standard form of digital audio in computers, compact disks (CDs), digital telephony and other digital audio applications. In a PCM stream, the amplitude of the analog signal is sampled and digitized regularly at uniform intervals.

Figure 2A:
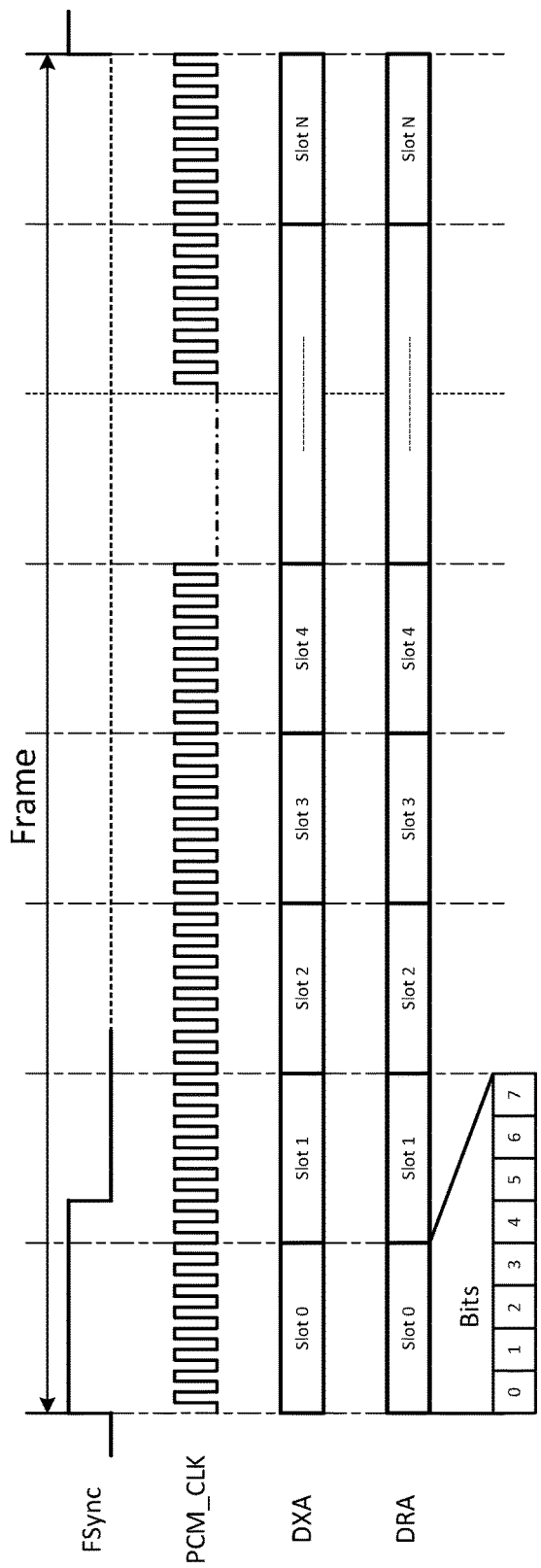
FIG. 2A illustrates an example timing diagram of digital data communication using time division multiplexing/pulse code modulation (TDM/PCM)

FIG. 2A illustrates an example timing diagram 200A of digital data communication between devices using time division multiplexing/pulse code modulation (TDM/PCM). The PCM interface typically includes 4 pins: frame synchronization pulse (FSYNC), PCM clock (PCM_CLK), output (transmit) data highway (DXA), and input (receive) data highway (DRA).

TDM/PCM audio interface protocols require strict clock periods. The PCM interface typically requires an additional master clock (not shown in FIG. 2A) to generate and synchronize with PCM_CLK. The master clock is typically a 49.152 MHz clock input, which may be provided by a crystal oscillator, a phase-lock loop (PLL), or otherwise generated by a SoC device. PCM_CLK is used to sample or latch received input data on highway DRA, and shift or drive output data on highway DXA. PCM_CLK may be one of 8.192 MHz, 6.144 MHz, 4.096 MHz, 3.072 MHz, 2.048 MHz, 1.536 MHz, or 1.024 MHz, which is equal to the frequency of the 49.152 MHz master clock divided by an integer number of 6, 8, 12, 16, 24, 32, or 48, respectively. Frame synchronization pulse FSYNC identifies the beginning of a frame, and is at a rate of an audio sample rate of, for example, 8 KHz. PCM_CLK and F SYNC are generally synchronized to the master clock.

In PCM mode, audio data may be transmitted on serial PCM output data highway DXA, or received on serial PCM input data highway DRA, using FSYNC and PCM_CLK as references. Data on DXA and DRA in a frame may comprise one sample from each channel (or slot) of a plurality of channels (or slots), where each sample may be represented by, for example, 8 bits. Thus, the data rate of DXA or DRA is proportional to the frame rate, the number of channels (slots) in a frame, and the number of bits representing one sample from a channel. For example, at a sample rate (or frame rate) of 8 KHz and a digitizing resolution of 8 bits, the data rate for a system with 1024 channels (slots) is 1024×8 bits×8 KHz, or 8.192 Mbps. Thus, PCM_CLK used to sample the input data or drive the output data is at a frequency of 8.192 MHz. Data on DRA may be sampled on the falling edge of PCM_CLK, while data on DXA may be driven on the rising edge of PCM_CLK. Other edge arrangements can be used as well.

Figure 2B:
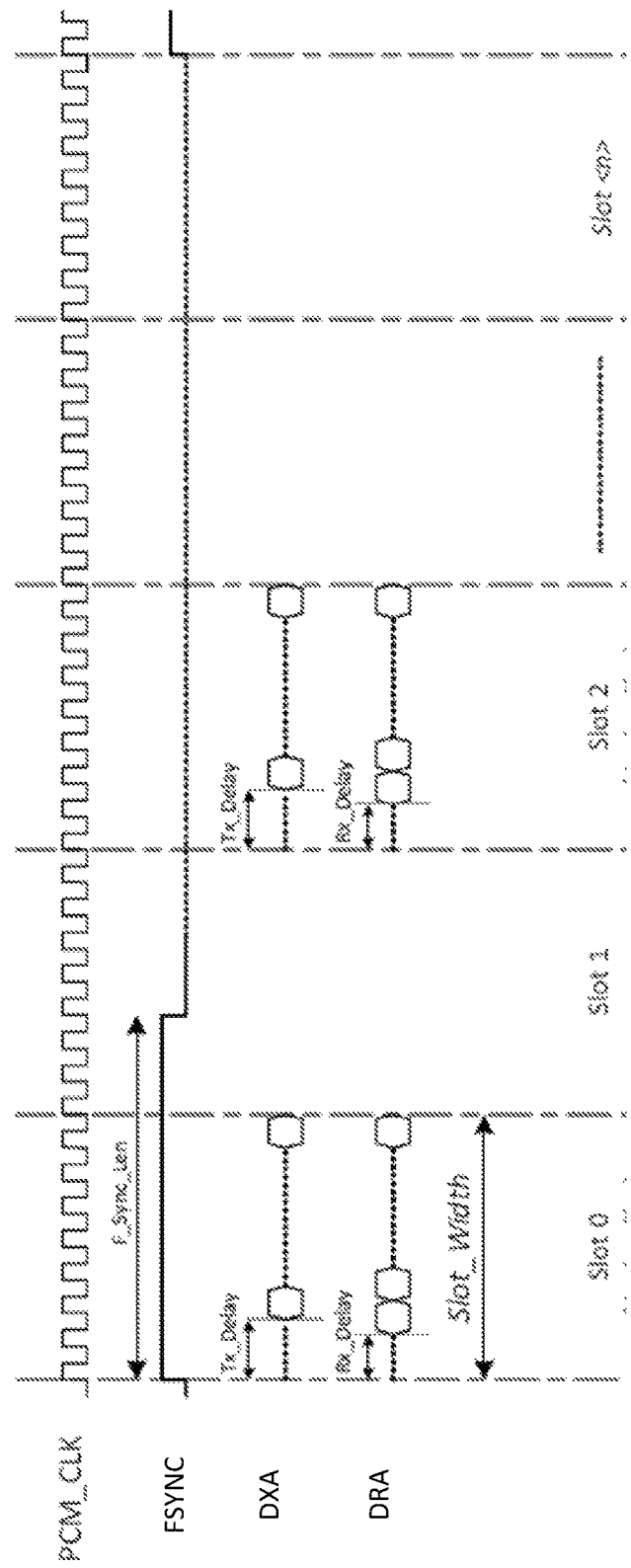
FIG. 2B illustrates another example timing diagram of digital data communication using TDM/PCM.

FSYNC identifies the beginning of a frame, and may be used as reference for all other timings in the PCM interface. As shown in timing diagram 200B of FIG. 2B, time slots in DRA and DXA may be delayed to compensate for any clock skew in the system.

When timing edges of signals on these pins are not aligned properly on a single device or between two interfacing devices, data error will appear on audio data on at least some channels. For example, if PCM_CLK and data on DRA or DXA are not aligned properly on a single device or between two interfacing devices, data from one channel may be allocated to another channel. If a frame does not have a desired number of clock cycles, data may be missing from some channels, or some channels may have extra samples. Thus, noise and/or distortion may appear on the captured audio data, causing degradation of audio quality and suffering of user experience.

3. Microprocessor Interface (MPI)

The microprocessor interface (MPI) is a 4-wire SPI compatible interface for passing control information from a master device to a slave device and bringing status information from the slave device back to the master device. MPI interface includes a serial data input (DIN), a serial data output (DOUT), a data clock (DCLK), a chip select (CS_N) and an interrupt signal (INT). Chip select CS_N and interrupt signal INT may be active low logic or active high logic.

Figure 3:
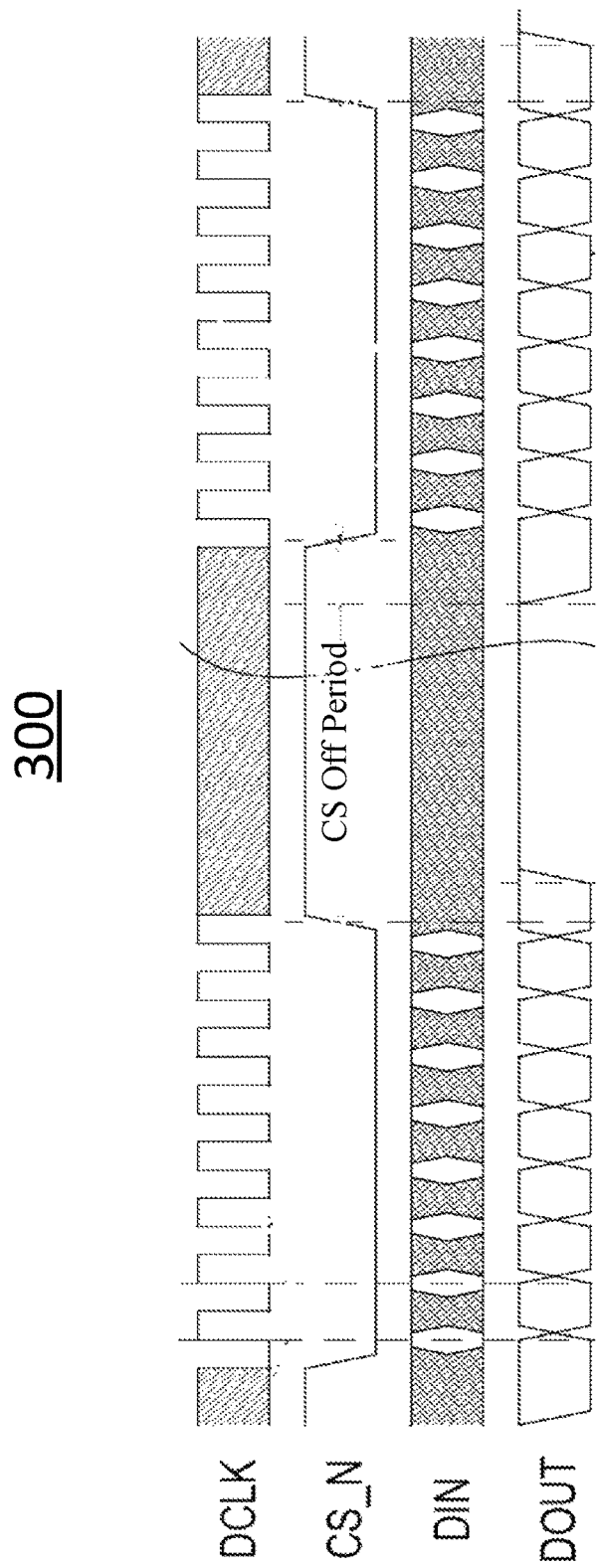
FIG. 3 illustrates a timing diagram of digital data communication using microprocessor interface (MPI)

FIG. 3 illustrates a timing diagram 300 of digital data communication using MPI interface, where interrupt signal INT is not shown. MPI interface may be asynchronous to the other interfaces. DCLK may be any frequency up to a master clock of, for example, 49.152 MHz. CS_N and DIN inputs may be sampled on the rising edge of DCLK. DOUT may be driven on the rising edge of DCLK. The serial input consists of 8-bit commands that may be followed by additional bytes of input data, or bytes of output data.

An MPI cycle is defined by transitions of CS_N and DCLK. Data bytes are read or written one at a time. If CS_N is held in high state between accesses, DCLK may run continuously without changing the control data. Thus, one DCLK can be used for a plurality of devices with MPI interface, and CS_N can be used to select an individual device from the plurality of devices for communication.

4. Zarlink Serial Interface (ZSI)

Figure 4A:
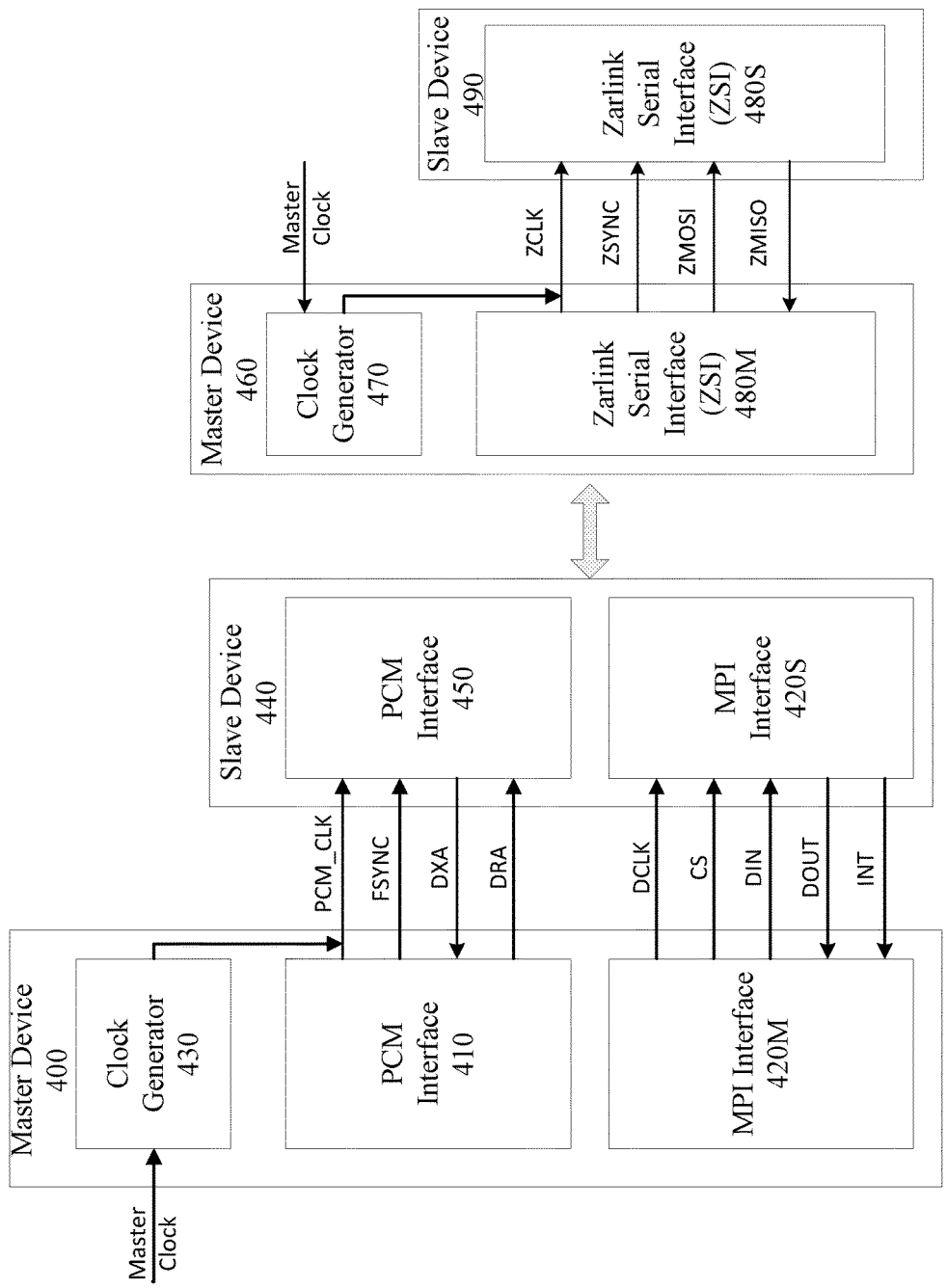
FIG. 4A illustrates an example block diagram of merging a PCM interface and an MPI interface into a Zarlink serial interface (ZSI)

To reduce pin count on the master and slave devices, and thus the size of the devices and signal routing area on board, PCM interface and SPI compatible interfaces, such as MPI interface, can be converted into any hybrid interface with less pin count. For example, as shown in FIG. 4A, the 4-pin PCM interface (FSYNC, PCM_CLK, DXA and DRA) between PCM interface 410 on master device 400 and PCM interface 450 on slave device 440, and the 5-pin MPI interface (DCLK, CS, DIN, DOUT and INT) between MPI interface 420M on master device 400 and MPI interface 420S on slave device 440 can be merged into a 4-pin Zarlink serial interface (ZSI) interface (ZCLK, ZSYNC, ZMOSI and ZMISO) between ZSI interface 480M on a master device 460 and ZSI interface 480S on slave device 490. Thus, 5 pins can be removed from each master or slave device. A clock generator 430 or 470 may be included on at least master device 400 or 460 to generate synchronized PCM_CLK and FSYNC for communication between the master and slave devices. ZSI interface can transfer audio data, MPI traffic, and signaling information between two devices.

Figure 4B:
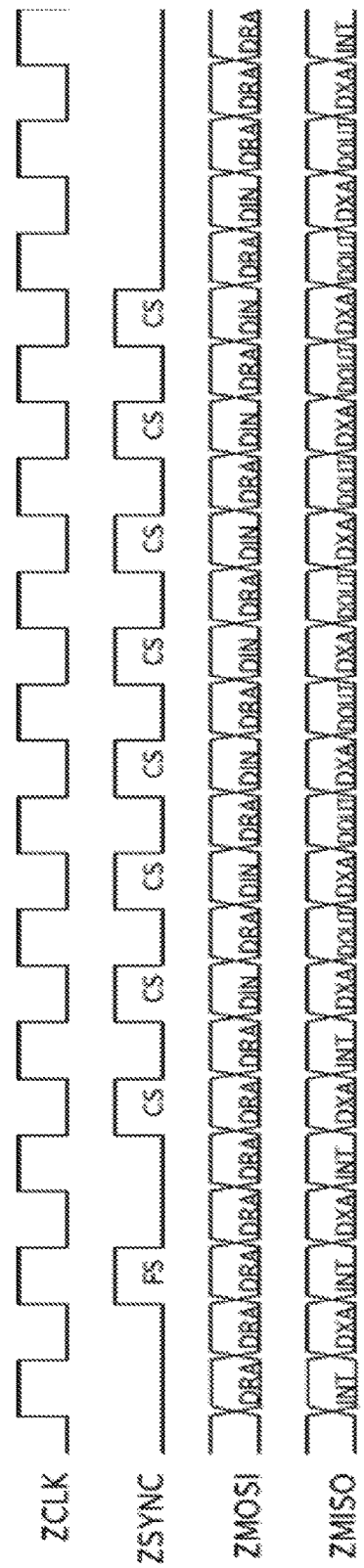
FIG. 4B illustrates a timing diagram of digital data communication using Zarlink serial interface (ZSI)

FIG. 4B illustrates a timing diagram 450 of digital data communication using ZSI interface. ZSI clock ZCLK is the PCM_CLK passed through, which may be, for example, 1.024 MHz, 1.536 MHz, 2.048 MHz, 3.072 MHz, 4.096 MHz, 6.144 MHz, or 8.192 MHz. PCM F SYNC and MPI CS signals are multiplexed together on ZSYNC. PCM DRA and MPI DIN signals are multiplexed on ZMOSI, and PCM DXA and MPI DOUT signals are multiplexed on ZMISO, based on the level of ZCLK. Interrupt status is also communicated through ZMISO.

As described above, a clock with a frequency of 8.192 MHz is commonly used in TDM/PCM protocol or other variations of TDM/PCM protocol. This 8.192 MHz clock is typically generated by dividing an external crystal oscillator of a specific frequency, such as 49.152 MHz, by an integer number, such as 6, using a clock divider on a chip. Synchronization of the clock from the oscillator and clocks for other parts of a system may be needed in some application as well. In order to reduce the cost and complexity of the system, it is desirable to generate a target clock from an existing clock source in the system, such as, for example, a 500 MHz system bus clock (SBCLK) or a 428.571 MHz SoC clock that is available on an SoC. In this way, there is no need for an external crystal oscillator and its associated hardware on board; thus the complexity and total cost of the system can be reduced.

However, in many cases, deriving a clock with a specific frequency, such as 8.192 MHz, from a reference clock with another specific frequency, such as 500 MHz or 428.571 MHz, may require a unique dividing ratio that is not an integer or a half of an integer, such as 61.03516, which is not a common practice dividing ratio and is difficult to implement.

II. Generating a Target Clock of a Specific Frequency from A Faster Reference Clock In some embodiments of the present disclosure, a method of generating a target clock with a specific frequency from an existing reference clock used in the system is disclosed, where the desired ratio between frequencies of the reference clock and the target clock is neither an integer nor a half of an integer, such as a non-integer ratio of 61.03516 for generating a 8.192 MHz target clock from a 500 MHz reference clock. The method uses two or more boundary integer dividing ratios that are close to the desired non-integer ratio instead of the desired non-integer ratio itself. In one embodiment, the reference clock is divided with each of the two boundary integer dividing ratios for a pre-determined number of cycles within a frame to effectively achieve the desired non-integer dividing ratio. A dynamic sensing and tuning method to compensate any drift and reduce error is also disclosed.

Figure 5A:
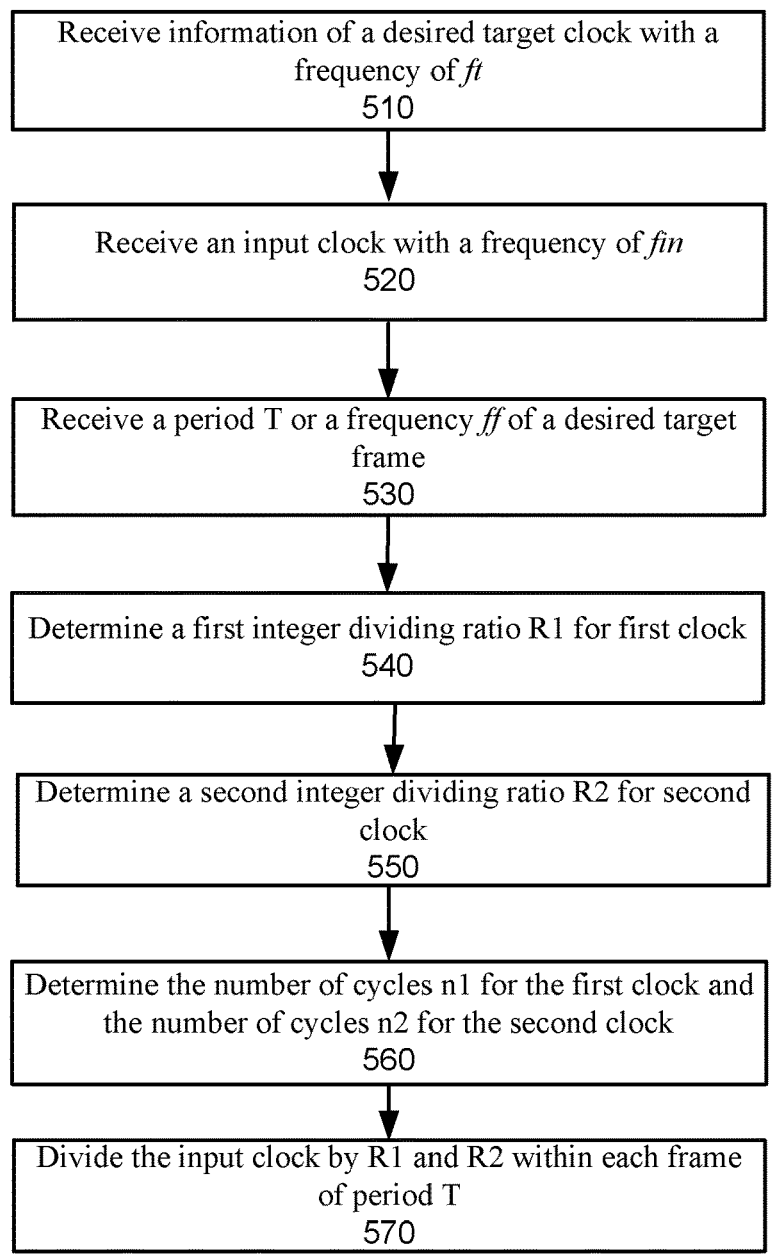
FIG. 5A illustrates one embodiment of a flow of generating a target clock by effectively dividing an input clock by a non-integer number.

FIG. 5A illustrates a flow diagram 500 for generating a target clock by effectively dividing an input reference clock by a non-integer number. At block 510, information about the desired target clock is received. The information may include clock frequency ft and/or stabilization/accuracy of the target clock. At block 520, an input reference clock with a frequency of fin is received. The reference clock may be any clock that is faster than the desired target clock, provided that the period of the reference clock is less than the desired stabilization/accuracy, such as jitter tolerance, of the target clock. At block 530, information regarding a desired target frame, such as a period T or a frequency ff, is received or determined. A total number of cycles N of the target clock in frame period T may be provided directly, or determined indirectly using period T (or frequency ff) of the target frame and the period or frequency ft of the target clock. Based on the received or determined information, a logical method can be employed to determine the optimum integer dividing ratios and their corresponding cycles in a frame.

At block 540, a first integer dividing ratio R1 for generating a first clock from the reference clock may be determined based on a ratio R between frequencies of reference clock fin and target clock ft, where R=fin/ft. In some embodiments, R1 may be an integer number close to R. In some embodiments, R1 may be an integer closest to R, such that the deviation of the first clock from the target clock is minimized. R1 may be larger or smaller than R. For example, if R is 5.1234567, R1 may be set to 5; if R is 5.7654321, R1 may be set to 6. If R1 is larger than R, the first clock is slower and thus has a longer clock period than the target clock. If R1 is less than R, the first clock is faster and thus has a shorter clock period than the target clock.

At block 550, a second integer dividing ratio R2 for generating a second clock (or tuning clock) from the reference clock may be determined based on R and R1. In some embodiments, R2 may be an integer number close to R. In some embodiments, R2 may be a second closest integer to R, such that the deviation of the generated clock from the target clock can be minimized. If R1 is larger than R, R2 may be an integer less than R. If R1 is less than R, R2 may be an integer larger than R. For example, as in the above examples, if R is 5.1234567, R1 may be set to 5 and R2 may be set to 6; if R is 5.7654321, R1 may be set to 6 and R2 may be set to 5. Thus, R1 can be used to generate the first clock closest to the target clock, and R2 can be used to generate the second clock as a tuning clock to compensate for the deviation of the first clock from the target clock.

At block 560, a number of cycles n1 for the first clock and a number of cycles n2 for the second clock in a frame are determined based on period T of the frame and clock period T1 of the first clock and clock period T2 of the second clock, such that the total accumulative time of n1 cycles of the first clock and n2 cycles of the second clock is substantially equal to period T of the frame. In some embodiments, the number of cycles n2 for the second clock may be determined by $n2=\text{Round}((T-N \times T1)/(T2-T1))$, where Round( ) is a function that rounds a number to the closest integer. The number of cycles n1 for the first clock may be determined by n1=N−n2 accordingly.

At block 570, in each frame period, the input reference clock fin is divided by the integer dividing ratio of R1 to generate n1 cycles of the first clock, and divided by integer dividing ratio of R2 to generate n2 cycles of the second clock, using an integer clock diver. As a result, an effective (or equivalent) frequency of the generated clock, that is, the total number of cycles of the first clock and the second clock (n1+n2) divided by the total accumulative time of n1 cycles of the first clock and n2 cycles of the second clock, is substantially equal to the frequency of the target clock. The clock divider may be a counter whose full-scale count value may be reconfigured dynamically. In some embodiments, the clock divider may have registers or memory to store the dividing ratios, which may be read out as needed to set the dividing ratios of the clock divider. The clock divider may be controlled by a control unit that can configure the clock divider dynamically and control the operation of the clock divider.

In order to minimize the deviation of the generated clock from the desired target clock in each clock cycle, the n1 cycles of the first clock and n2 cycles of the second clock may be distributed in frame period T such that an accumulated clock drifting caused by the first clock with a shorter or longer period than the target clock can be compensated by the second clock as early as possible to minimize the deviation. In various embodiments, the cycles of the first clock and the second clock may be distributed substantially evenly, randomly, uniformly, or monotonically within the frame period. By distributing the cycles of the second clock (tuning clock) and/or the first clock within a frame, accumulated time error of the generated clock at any time within the frame can be compensated early before the accumulated time error becomes too large. With evenly distributed or substantially evenly distributed tuning clock cycles, where each tuning cycle is separated by equal or substantially equal number of cycles of the first clock, the maximum accumulated time error within a frame may be minimized. In certain aspects of the disclosure, distributing the cycles of the first clock and the second clock substantially evenly may refer to the first number of cycles of the first clock and the second number of cycles of the second clock distributed among each other within the period of the frame such that each cycle of the second clock is separated by one of two integer numbers of cycles of the first clock, wherein the two integer numbers are two consecutive integers.

Figure 5B:
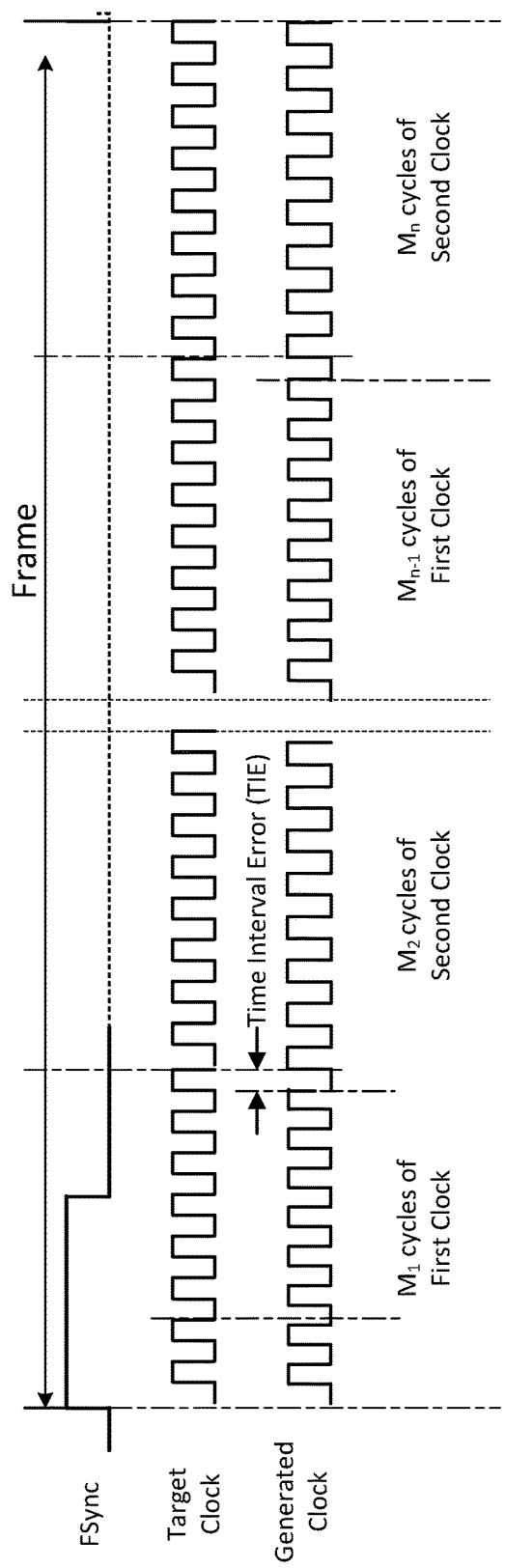
FIG. 5B illustrates a timing diagram of a target clock and a generated clock using a flow described in FIG. 5A.

FIG. 5B illustrates an example of timing diagram of a target clock and a generated clock within one frame using a flow described above with respect to FIG. 5A. As shown in FIG. 5B, cycles of a first clock are generated from a reference clock using an integer number smaller than the ideal non-integer dividing ratio. Thus, the first clock in the generated clock has a period shorter than the target clock, and the edges of the generated first clock are not aligned with the edges of the ideal target clock. As explained above, time interval error (TIE) of a clock edge is generally defined as the time deviation of that clock edge from its ideal position measured from a reference point. An example TIE between the falling edges of the eighth generated clock and the eighth target clock from the beginning of a frame is shown in FIG. 5B. To compensate for the TIE, cycles of a second clock, which has a period longer than the target clock, are generated from the reference clock using an integer dividing ratio larger than the ideal dividing ratio, to replace some cycles of the first clock in a frame as shown in FIG. 5B. Because the period of the first clock is shorter than the target clock and the period of the second clock is longer than the target clock, the combination of the first clock and the second clock yields a clock with an effective period equal to the period of the ideal target clock.

As shown in FIG. 5B, where $M_1$ to $M_n$ may be many different integer values, many different distributions of cycles of the first clock and cycles of the second clock are possible. It is generally desirable to substantially evenly distribute the first clock and the second clock throughout a frame such that the deviation of any generated clock cycle from the ideal clock at the same cycle is minimized. For example, in FIG. 5B, the number of cycles for the second clock, such as $M_2$ and $M_n$, may be 1, and the number of cycles for the first clock, such as $M_1$ and $M_{n-1}$, may be a same integer number or two consecutive integers, such as, for example, 26 and 27 if a ratio of n1 to n2 discussed above with respect to FIG. 5A is, for example, between 26 and 27.

In some embodiments, the input reference clock may be divided by more than two dividing ratios in a frame period, according to the method described above, in order to generate a target clock that is effectively the reference clock divided by a non-integer value with minimum accumulative drift or error, when no exact frame period match can be achieved using two dividing ratios in a frame period.

In some embodiments, clock dividers with a dividing ratio of a half of an integer may be relatively easy to implement, and thus can be used to effectively divide a reference clock by a non-integer ratio that is not a half of an integer. Therefore, any of the two or more clock dividing ratios may be one of an integer or a half of an integer. For example, one of the two or more dividing ratios may be 61, and another one of the two or more dividing ratios may be 61.5. The two or more dividing ratios and their corresponding numbers of cycles may be determined using a similar method as discussed above.

Two examples according to the method discussed above are provided below, again using PCM interfaces as examples. The first example illustrates a situation where there is zero drift accumulated in a frame; therefore no drift will be accumulated at boundaries of the frames over multiple frames. The second example illustrates a situation where a small but non-zero drift may be accumulated within a frame with a default setting, and the non-zero drift may be accumulated to a significant amount over multiple frames, and thus may require further tuning.

1. Example I

FIG. 6 illustrates an example of generating a target clock by effectively dividing an input clock by a non-integer number, where no drift is accumulated in a frame. The example provides a method of generating a target PCM clock with a frequency of 8.192 MHz from a 500 MHz SBCLK, where audio signals are sampled at a sample rate of 8 KHz, or once every 125 microseconds (μs).

In the example shown in FIG. 6, the TDM/PCM interface includes 128 channels or slots, wherein each slot includes an audio sample represented by a 8-bit data. Thus, there are 128×8=1024 bits in one frame. Since each channel is sampled at 8 KHz, the data rate of the transmitted data or received data is 1024×8=8.192 Mbps. Therefore, an 8.192 MHz PCM clock is used to capture the received data and shift out the transmitted data. The corresponding clock period of the 8.102 MHz PCM clock is about 122.0703125 nanoseconds (ns).

The ratio between the frequencies of SBCLK and the ideal PCM clock is thus about 500/8.192=61.03515625, which is a dividing ratio difficult to implement. Instead, a first dividing ratio of 61 is selected, which is rounded down from the ideal ratio of about 61.03515625. A resultant first clock frequency from dividing SBCLK by 61 is about 8192.721 KHz, or a clock period of 122 ns. In order to compensate for the shorter clock period of the resultant first clock, a second dividing ratio of 62 is used to generate a second (tuning) clock with a frequency of about 8065.516 KHz, or a clock period of 124 ns.

Since the total number of clock cycles or number of bits in a frame is 1024, the total number of clock cycles of the first clock and the second clock should be 1024 as well for proper capturing and shifting of data in the frames. To determine the number of cycles for the first clock and the number of cycles for the second clock, a difference between the frame period of 125 μs and 1024 cycles of the first clock is determined to be about 72 ns, which indicates the time difference that needs to be compensated by the second (tuning) clock in a frame. Because each second clock period is 2 ns longer than a first clock period, 36 cycles of second clock can be used to compensate for the about 72 ns difference. Thus, the number of cycles of the second clock in a frame can be set to 36, and the number of cycles of the first clock in the frame can be set to 1024−36=988 accordingly.

As a result, the accumulative time of 36 cycles of the second clock and 988 cycles of the first clock is 36×124+988×122=125,000 ns or 125 μs, which is exactly the desired frame period. Therefore, there is no difference between the period of an ideal frame and the period of the generated frame of 1024 clock cycles.

If all 988 cycles of the first clock are generated first by dividing the 500 MHz SBCLK by 61, the accumulative time difference between 988 cycles of the target clock and 988 cycles of the first clock would be about 988×(122.0703125−122)=69.46875 ns, which means that the 988th cycle in the generated clock is about 70 ns earlier than the 988th cycle of the target clock, a deviation much greater than the 25 ns tolerance in PCM specification. Thus, it is desirable to distribute the first clock and the second clock throughout a frame such that the deviation of any generated clock cycle from the ideal clock at the same cycle is within the specification. For example, if 14 cycles of the first clock are generated, followed by repeated patterns of one cycle of the second clock and 27 cycles of the first clock, the maximum time interval error (TIE) or deviation between the generated clock and the target clock may be about ±1 ns. Because the jitter tolerance of the PCM specification is 25 ns, many other arrangements of the cycles of the first clock and the second clock are possible to generate a clock that meets the PCM timing specification.

2. Example II

FIG. 7 illustrates an example of generating a target clock by effectively dividing an input clock by a non-integer number, where no integer compensation will reach an exact match; thus a non-zero drift may be accumulated in a frame. The example provides a method of generating a target PCM clock with a frequency of 8.192 MHz from a 428.571 MHz SoC clock, where audio signals are sampled at a sample rate of 8 KHz, or once every 125 microsecond (μs).

In the example shown in FIG. 7, the TDM/PCM interface includes 128 channels or slots, wherein each slot includes an audio sample represented by a 8-bit data. Thus, there are 128×8=1024 bits in one frame. Since each channel is sampled at 8 KHz, the data rate of the transmitted data or received data is 1024×8=8.192 Mbps. Therefore, an 8.192 MHz PCM clock is used to capture the received data and shift out the transmitted data. The corresponding clock period of the 8.192 MHZ PCM clock is about 122.0703125 ns.

The ratio between the frequencies of the SoC clock and the ideal PCM clock is thus about 428.571/8.192=52.3157959, which is a dividing ratio difficult to implement directly using a clock divider. Instead, a first dividing ratio of 52 is selected, which is rounded down from the ideal ratio of 52.3157959. Thus, the resulted first clock frequency from dividing the SoC clock by 52 is about 8241.75 KHz, or a clock period of about 121.3334547 ns. In order to compensate for the shorter clock period of the resulted first clock, a second dividing ratio of 53 is used to generate a second (tuning) clock with a frequency of about 8086.245 KHz, or a clock period of about 123.6667903 ns.

Since the total number of clock cycles or number of bits in a frame is 1024, the total number of clock cycles of the first clock and the second clock should be 1024 as well for proper capturing and shifting of data in the frames. To determine the number of cycles for the first clock and the number of cycles for the second clock, a difference between the frame period of 125 μs and 1024 cycles of the first clock is determined to be about 755 ns, which indicates the time difference that needs to be compensated in a frame by the second tuning clock. Because each second clock period is about 2.3333356 ns longer than a first clock period, about 323 cycles of the second clock can be used to compensate for the about 755 ns difference. Thus, the number of cycles of the second clock in a frame can be set to 323, and the number of cycles of the first clock in the frame can be set to 1024−323=701 accordingly.

As a result, the accumulative time of 323 cycles of the second clock and 701 cycles of the first clock is 323×123.6667903+701×121.3334547=124999.125 ns, which is about 0.875 ns shorter than the period of an ideal frame. Thus, such integer compensation will not reach an exact match of the desired frame period. A tolerable time error of the match may be different for different applications.

As discussed above with respect to Example I, it is desirable to distribute the first clock and the second clock throughout a frame such that the deviation of any generated clock cycle from the ideal clock at the same cycle is within the specification. Many arrangements are possible in order to generate a clock that meets the PCM timing specification. For example, the cycles of the two clocks may be distributed substantially evenly, randomly, uniformly, or monotonically within a frame period.

Thus, in some special cases, for example, when a reference clock is at 428.571 MHz, there may not be an integer compensation that will reach an exact match of the desire frame period. In such cases, the time error, if not corrected otherwise, may accumulate over time to a substantially large value. For example, in Example II, where a reference clock of 428.571 MHz is used to generate the 8.192 MHz PCM clock, a timing error of about 0.875 ns is accumulated in one frame, and about 87.5 ns of error could be accumulated after 100 frames, which does not meet the PCM timing specification. A dynamic tuning method as described below may be used to correct the accumulated errors in these cases.

III. Dynamic Tuning to Reduce Accumulated Non-Zero Drift

In this section, a method is provided for monitoring the generated clock and dynamically tuning the setting of a clock divider or its control unit to keep the timing of the generated clock within a pre-defined margin of specified target value. If the generated clock fails to stay within the pre-defined margin, a temporal tuning of pre-programmed setting is executed, leading to a dynamic deviation that is within a margin of the specified target value.

Figure 8A:
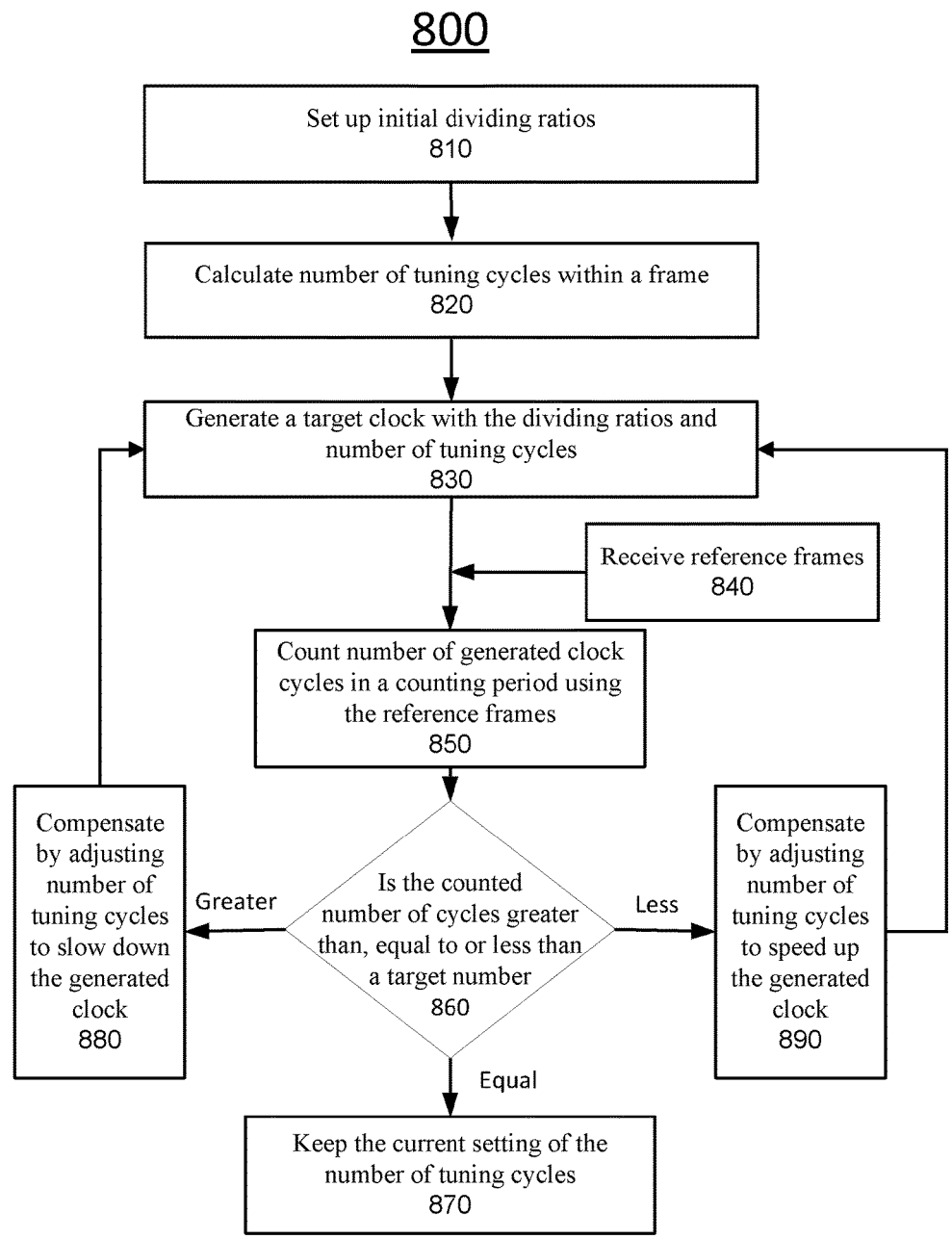
FIG. 8A illustrates an embodiment of a flow of reducing accumulated non-zero drift in the frames.

FIG. 8A illustrates an embodiment of a flow 800 of compensating accumulated non-zero drift in the frames. At block 810, the initial dividing ratios for a first clock and a second clock (or tuning clock) can be determined and set using methods described above with respect to FIGS. 5-7. As described above, the initial diving ratios may be an integer number or a half of an integer. At block 820, a number of tuning cycles (or second clock cycles) can be determined and set using methods described above with respect to FIGS. 5-7.

At block 830, a clock divider divides the reference clock based on the setting of the initial dividing ratios, the numbers of tuning cycles, and a determined distribution of the first clock cycles and the tuning cycles within a frame, to generate a target clock. A control unit may be used to dynamically configure the clock divider and control the operation of the clock divider according to methods disclosed herein.

At block 840, reference frames, such as cycles of a clock with a frequency of 8 KHz, are received and used for counting the number of generated clock cycles within a counting period, such as one reference frame or multiple reference frames. At block 850, the number of generated clock cycles within a counting period is counted by, for example, starting the counter at the beginning of a counting period and stopping the counter at the end of the counting period.

At block 860, the counted number of cycles in the countering period is compared with a specified target number. The target number may be specified based on allowed jitter tolerance or other timing specification of the protocols used in the system. If the counted number is equal to or within a specified range of the target number, the generated clock meets the timing specification, and the current setting of the clock divider is not changed at block 870. If the counted number is greater than the specified target number, the generated clock is faster than the target clock, and should be slowed down. This can be achieved by changing the number of tuning cycles (or the second clock cycles) at block 880. If the period of the tuning cycles is longer than the period of the first clock, the number of tuning cycles may be increased to slow down the generated clock. If the period of the tuning cycles is shorter than the period of the first clock, the number of tuning cycles may be decreased to slow down the generated clock. On the other hand, if the counted number is less than the specified target number, the generated clock is slower than the target clock, and should be made faster, which may be achieved by changing the number of tuning cycles (or the second clock cycles) at block 890. If the period of the tuning cycles is longer than the period of the first clock, the number of tuning cycles may be decreased to generate a faster clock. If the period of the tuning cycles is shorter than the period of the first clock, the number of tuning cycles may be increased to generate a faster clock.

The adjusted number of the tuning cycles can be used to update the setting of the clock divider or the control unit at block 830 to generate a new clock, which can then be monitored and tuned if necessary by repeating blocks 830 to 890, until the counted number of the generated clock is equal to or within the specified range of the target number.

Figure 8B:
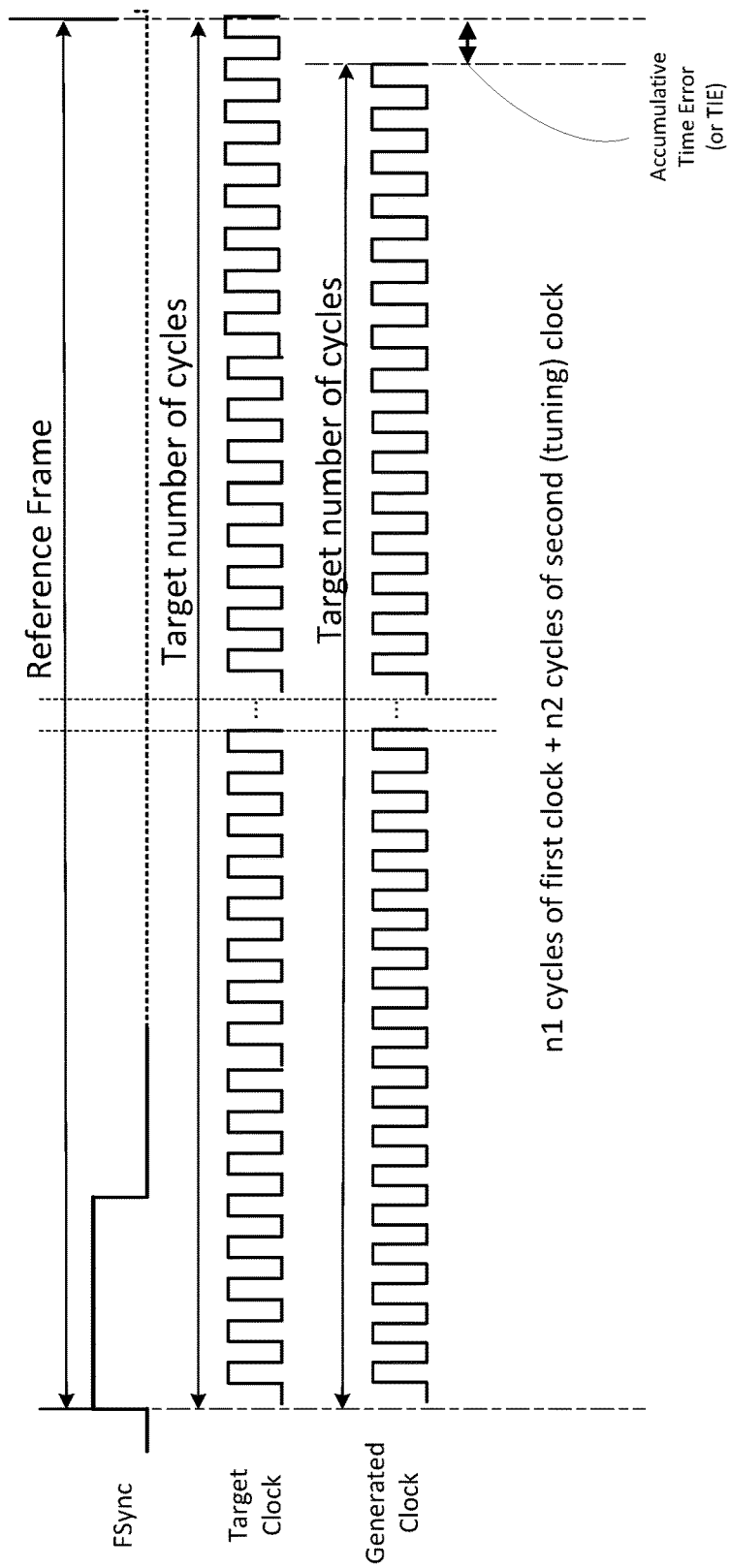
FIG. 8B illustrates a timing diagram of a target clock and a generated clock, where the generated clock is faster than the target clock.

FIG. 8B illustrates a timing diagram of a target clock and a generated clock including n1 cycles of a first clock and n2 cycles of a second (tuning) clock in a frame, where the period of the first clock is shorter than the target clock, the period of the second clock (tuning clock) is longer than the target clock, and the generated clock is faster than the target clock under a default setting before a flow described in FIG. 8A is implemented. As a results, a non-zero TIE exists at the end of the reference frame after the specified target number of cycles as shown in FIG. 8B, and the counted number of generated clock cycles is greater than the specified target number within the reference frame.

Figure 8C:
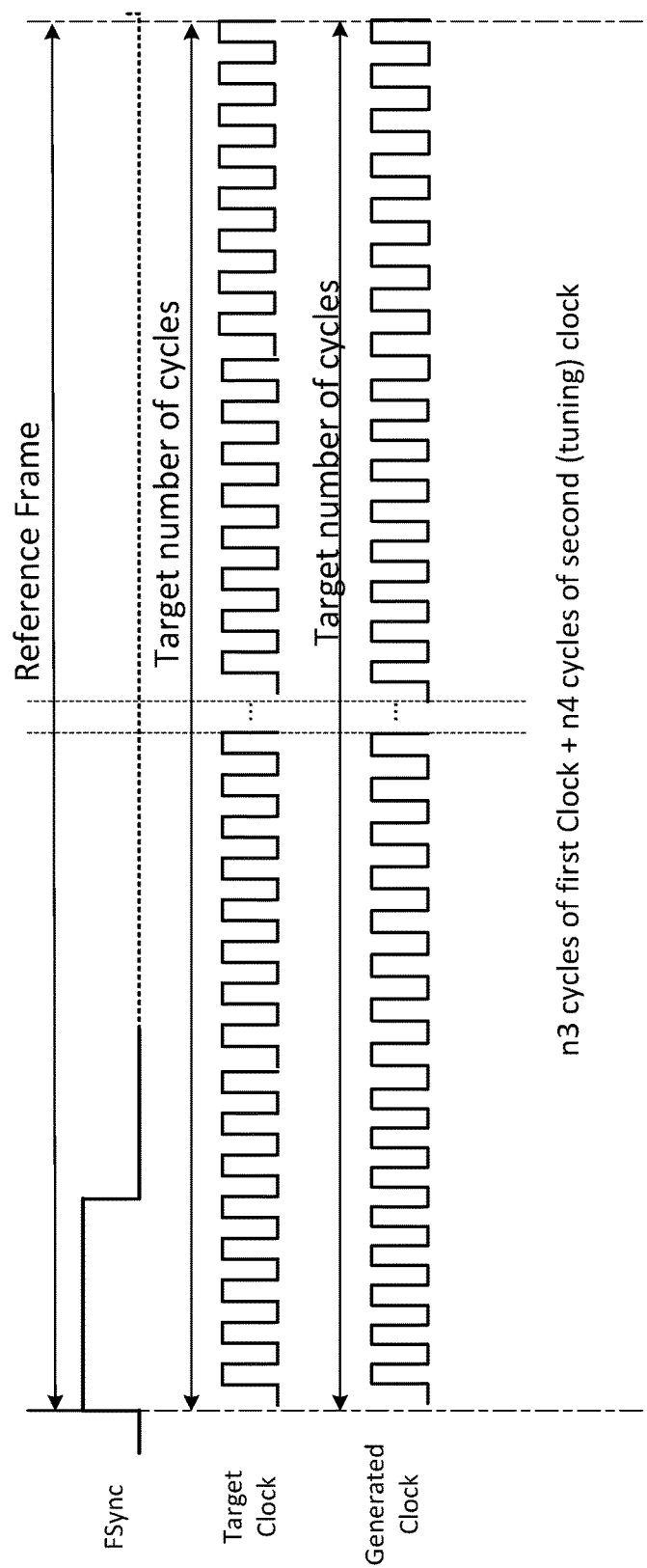
FIG. 8C illustrates a timing diagram of a target clock and a generated clock using a flow described in FIG. 8A.

FIG. 8C illustrates a timing diagram of a target clock and a generated clock using a flow described in FIG. 8A to tune the clock generated with the default setting as shown in FIG. 8B. Because the counted number of cycles within a reference frame in FIG. 8B is greater than the specified target number, the generated clock is faster than the target clock, and should be slowed down. This can be achieved by changing the number of tuning cycles (or the second clock cycles). Since the period of the tuning cycles is longer than the period of the first clock and the target clock, the number of tuning cycles can be increased to replace some cycles of the first clock to slow down the generated clock, while keeping the total number of clock cycles within the reference frame to the target number. For example, as shown in FIGS. 8B and 8C, the number of cycles of the first clock in a frame can be reduced from n1 to n3, and the number of cycles of the second (tuning) clock in a frame can be increased from n2 to n4, while keeping a sum of n3 and n4 equal to a sum of n1 and n2.

Additionally or alternatively, in some embodiments, one or more of the dividing ratios may be tuned to reduce drift and correct error, independently or in conjunction with the number of tuning cycles.

In some embodiments, the above described method may be performed continuously during the operation of the clock divider. In some embodiments, the above described method may be performed once during initialization or calibration.

With dynamic sensing of the deviation of the generated clock from the expected target clock, and the on-the-fly calibration and error reduction, the temporal convergence tuning scheme can operate to compensate any irrational drift. In some embodiments, the temporal convergence tuning scheme may use different hysteresis level, convergence deltas, compensation starting point, or other parameters to achieve a stable clock at a desired frequency.

Figure 9:
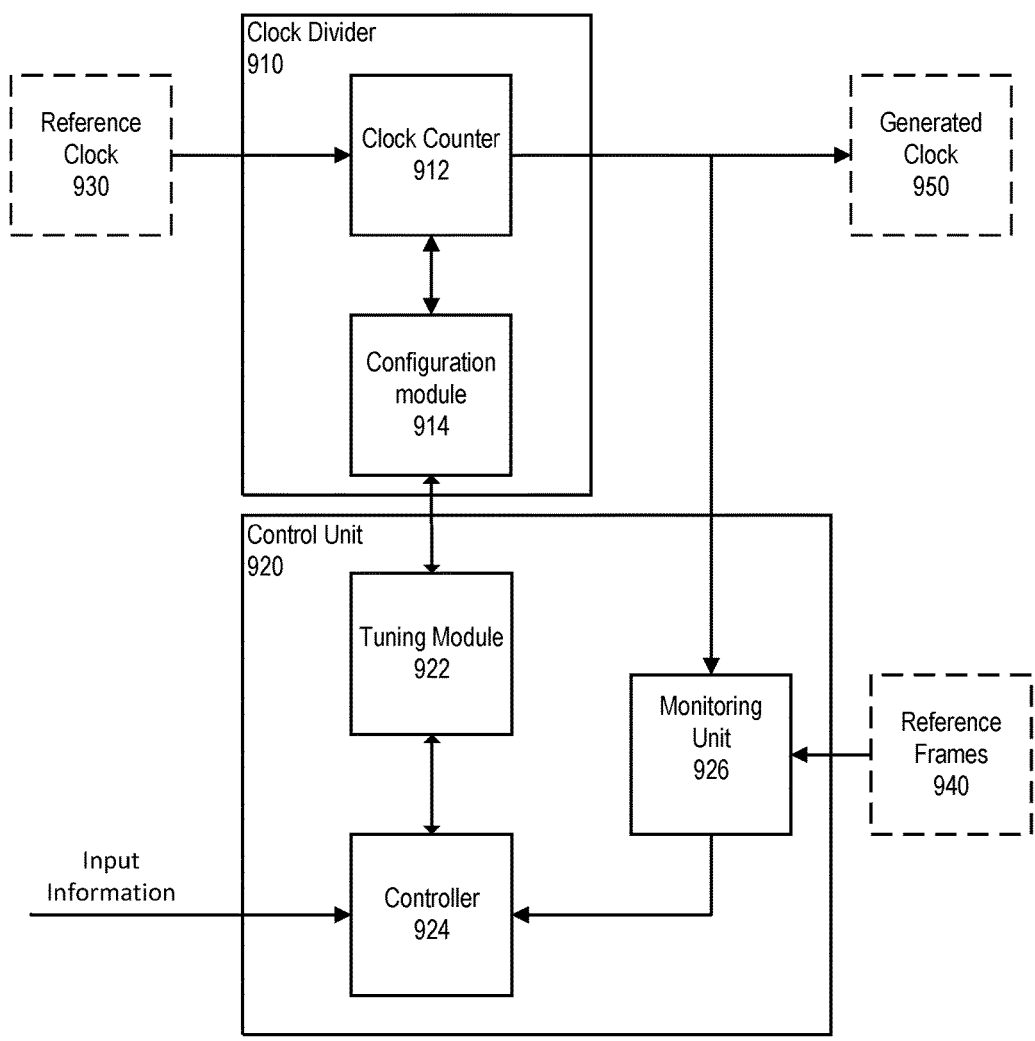
FIG. 9 illustrates a block diagram of a clock generator according to an embodiment of the present disclosure.

FIG. 9 illustrates a block diagram of a clock generator 900 according to an embodiment of the present disclosure, which may be configured to carry out a flow described above. Clock generator 900 takes input information about, for example, a desired target clock and audio data frame, and converts a reference clock 930 into a generated clock 950 that is close to the desired target clock. Clock generator 900 may include a clock divider 910 and a control unit 920.

In some embodiments, clock divider 910 is reconfigurable, and includes a clock counter 912 and a configuration module 914. Clock counter 912 may count the number of received reference clock, and toggle its output and reset the count value when the counted value reaches a full-scale count value, thus generating a divided-down clock from the reference clock. Configuration module 914 can dynamically reconfigure the full-scale count value of clock counter 912, such that different dividing ratios can be achieved at different times to generate clocks of different frequencies.

In some embodiments, control unit 920 may include a controller 924 that can determine the dividing ratios of clock divider 910, the corresponding number of clock cycles for each dividing ratio, and the distribution of the clock cycles for each dividing ratio within a frame, according to methods and flows described above in the present disclosure. Control unit 920 may then control configuration module 914 of clock divider 910 based on these determined settings to divide the reference clock.

In some embodiments, control unit 920 may also include a monitoring unit 926 and a tuning module 922 for monitoring and dynamically tuning generated clock 950 according to methods and flows described above with respect to FIG. 8A. In some embodiments, monitoring unit 926 may take inputs from reference frames 940, and count generated clock 950 within a counting period that may last a reference frame or multiple reference frames. Based on the monitoring results from monitoring unit 926, controller 924 may determine whether and how to tune current settings of configuration module 914, according to methods and flows described above with respect to FIG. 8A.

IV. System and Applications

Figure 10:
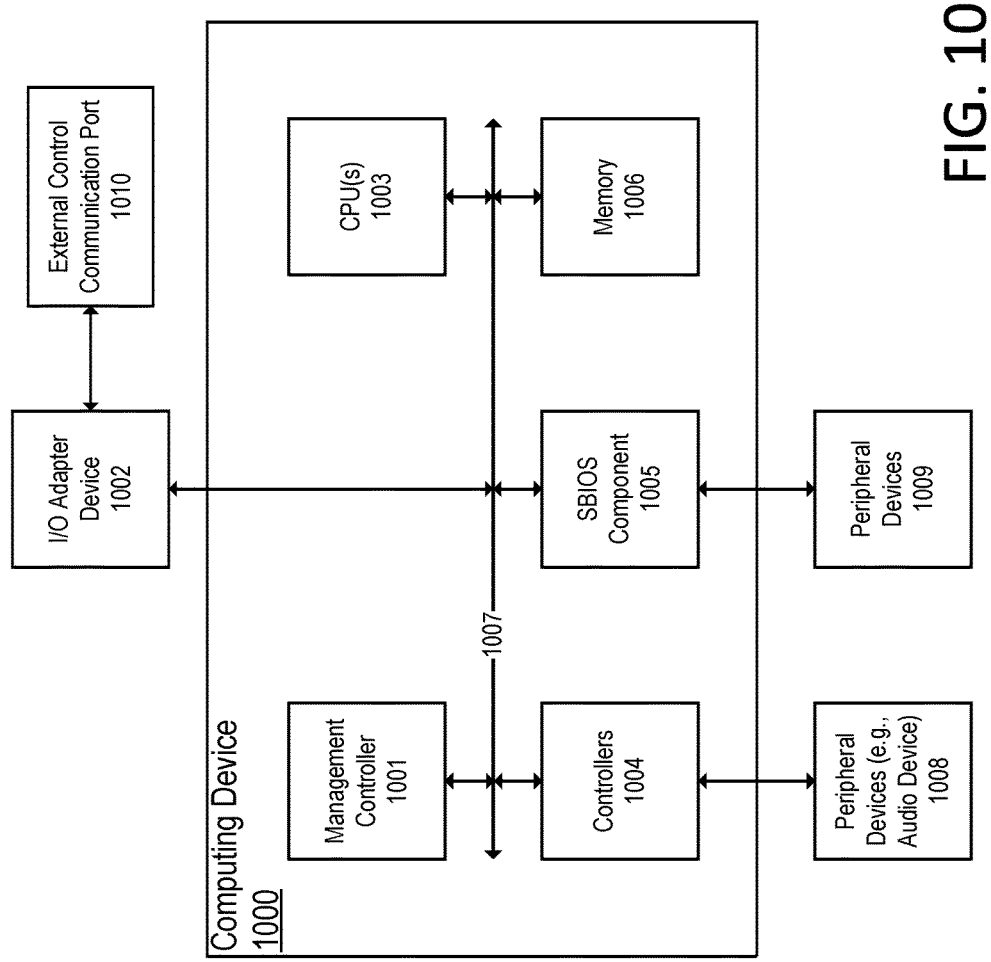
FIG. 10 illustrates a block diagram of a computing device where various clock frequencies for various components of the device may be generated according to various embodiments of the present disclosure.

The methods and clock generator described in the present disclosure can be used in many systems and applications where a clock of a specific frequency is desired. FIG. 10 illustrates a block diagram of a computing device 1000 where various clock frequencies on various components of the device may be generated according to various embodiments of the present disclosure. In an illustrative embodiment, computing device 1000 is associated with various hardware components, software components and respective configurations that facilitate data communications between various hardware components, which will be described in detail below. Specifically, in one embodiment, computing device 1000 can include a management controller 1001 for managing the operation of computing device 1000. Specifically, the management controller 1001 can include an embedded microcontroller that manages the interface between system management software and computing device 1000 components.

In communication with computing device 1000 is an I/O adapter device 1002. Generally, I/O adapter device 1002 may include any device that inputs and/or outputs data along a communication channel 1007. In one aspect, I/O adapter device 1002 can communicate as a standard bridge component for facilitating access between various physical and emulated components and a communication channel 1007. In another aspect, I/O adapter device 1002 can include embedded microprocessors to allow I/O adapter device 1002 to execute computer executable instructions related to the implementation of I/O adapter device 1002. In some embodiments, I/O adapter device 1002 may be implemented using multiple discrete hardware elements, such as multiple cards or other devices. In some embodiments, I/O adapter device 1002 is attached externally to computing device 1000. In some embodiments, I/O adapter device 1002 is internally integrated into computing device 1000.

Also in communication with I/O adapter device 1002 may be an external communication port component 1010 for establishing communication channels between computing device 1000 and one or more network based services or other network-attached or direct-attached computing devices. External communication port component 1010 can correspond to a network switch. I/O adapter device 1002 can utilize external communication port component 1010 to maintain communication channels between one or more services and computing device 1000.

computing device 1000 may also include a System Basic Input/Output System (SBIOS) component 1005. SBIOS component 1005 can include non-transitory executable code, often referred to as firmware, which can be executed by one or more processors and used to cause components of computing device 1000 to initialize and identify system devices such as the video display card, audio card, keyboard and mouse, hard disk drive, optical disc drive and other hardware. SBIOS component 1005 can also include or locate boot loader software that will be utilized to boot computing device 1000. For example, in one embodiment, SBIOS component 1005 can include executable code that, when executed by a processor, causes computing device 1000 to attempt to locate Preboot Execution Environment (PXE) boot software.

SBIOS component 1005 can be connected to (or in communication with) a number of additional computing device resources components, such as central processing units ("CPUs") 1003, memory 1006 (e.g., RAM), and the like. In one embodiment, such computing device resource components may be physical computing device resources in communication with other components via communication channel 1007. Communication channel 1007 can correspond to one or more communication buses, such as a shared bus (e.g., a front side bus, a memory bus), a point-to-point bus such as a PCI or PCI Express bus, etc., in which the components of the bare metal computing device 1000 communicate. Other types of communication channels, communication media, communication buses or communication protocols (e.g., the Ethernet communication protocol) may also be utilized. The computing device resource components may be in communication with I/O adapter device 1002 via communication channel 1007. In addition, although communication channel 1007 in FIG. 10 is shown as connecting all of components 1001-1006, it should be appreciated that a communication channel in accordance with some embodiments may connect any subset of the components 1001-1006 and/or other components. For example, a communication channel may connect a PCI Express device to a CPU via a north bridge or host bridge.

Computing device 1000 may also include one or more controller components 1004 for managing hard drives or other forms of memory. An example of a controller component 1004 can be a SATA hard drive controller.

Computing device 1000 can also include additional components that are in communication with one or more of the illustrative components associated with computing device 1000. Such components can include devices, such as one or more controllers 1004 in combination with one or more peripheral devices 1008, such as hard disks or other storage devices. Additionally, the additional components of computing device 1000 can include another set of peripheral devices 1009, such as Graphics Processing Units ("GPUs"), or audio processing units.

As shown in FIG. 10, computing device 1000 may include various components communicating with one another and/or communicating with various I/O devices or peripheral devices. These I/O devices, peripheral devices and components that communicate with one another may work at different clock frequency and/or different clock domains, and may require a plurality of specific clock frequencies for the communication interface between one another. For example, one or more of the peripheral devices or I/O devices may be an audio device, and may use TDM/PCM interfaces or variations of the TDM/PCM interface. It will be costly to use an oscillator for each of the plurality of specific clock frequencies. Using methods, flows and clock generators described herein, the plurality of specific clock frequencies may be generated from an existing faster master clock in the system, or a single oscillator, thus greatly reducing the complexity and cost of a system.

The drawings and the description above describe non-limiting embodiments of systems and methods. The specification and drawings are, accordingly, to be regarded in an illustrative rather than a restrictive sense. It will, however, be evident that various modifications and changes may be made thereunto without departing from the broader spirit and scope of the disclosure as set forth in the claims.

While the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the embodiments depicted herein are merely exemplary, and that in fact many other embodiments may be implemented while achieving the same functionality.

Also for example, in some embodiments, the illustrated examples may be implemented as circuitry located on a single integrated circuit or within a same device. Alternatively, in some embodiments, the examples may be implemented as any number of separate integrated circuits or separate devices interconnected with each other in a suitable manner.

Also for example, the examples, or portions thereof, may be implemented as software or code representations of physical circuitry, or of logical representations convertible into physical circuitry, such as in a hardware description language of any appropriate type.

Other modifications, variations and alternatives are also possible. The specifications and drawings are, accordingly, to be regarded in an illustrative rather than in a restrictive sense.

Some embodiments may include a variety of storage media and computer readable media for storing data and instructions for performing the disclosed methods. Storage media and computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules or other data, including RAM, ROM, Electrically Erasable Programmable Read-Only Memory ("EEPROM"), flash memory or other memory technology, Compact Disc Read-Only Memory ("CD-ROM"), digital versatile disk (DVD) or other optical storage, magnetic cassettes, magnetic tape, magnetic disk storage or other magnetic storage devices or any other medium which can be used to store the desired information and which can be accessed by the a system device. Based on the disclosure and teachings provided herein, a person of ordinary skill in the art will appreciate other ways and/or methods to implement the various embodiments.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A clock generator for generating a target clock, comprising:
 a clock divider circuit configured to:
  receive an input clock;
  generate, during a first portion of a frame period, a first clock that is slower than the target clock by dividing the input clock by a first dividing ratio; and
  generate, during a second portion of the frame period, a second clock that is faster than the target clock by dividing the input clock by a second dividing ratio,
  wherein a first ratio between a frequency of the input clock and a frequency of the target clock is a non-integer number.

2. The clock generator of claim 1, wherein a difference between the first dividing ratio and the second dividing ratio is 0.5 or 1.

3. The clock generator of claim 1, wherein the first dividing ratio is an integer or a half of an integer, and the second dividing ratio is an integer or a half of an integer.

4. The clock generator of claim 1, wherein:
the first dividing ratio is greater than the first ratio; and
the second dividing ratio is less than the first ratio.

5. The clock generator of claim 1, wherein:
one of the first dividing ratio and the second dividing ratio is an integer closest to the first ratio; and
the other one of the first dividing ratio and the second dividing ratio is an integer second closest to the first ratio.

6. The clock generator of claim 1, wherein:
the clock divider circuit is configured to divide the input clock by the first dividing ratio during the first portion of the frame period to generate a first number of cycles of the first clock;
the clock divider circuit is configured to divide the input clock by the second dividing ratio during the second portion of the frame period to generate a second number of cycles of the second clock; and
a sum of the first number of cycles and the second number of cycles is equal to a number of cycles of the target clock in the frame period.

7. The clock generator of claim 6, wherein the first number of cycles of the first clock and the second number of cycles of the second clock are distributed among each other within the frame period.

8. The clock generator of claim 1, wherein:
the clock divider circuit is configured to divide the input clock by the first dividing ratio during the first portion of the frame period to generate a first number of cycles of the first clock;
the clock divider circuit is configured to divide the input clock by the second dividing ratio during the second portion of the frame period to generate a second number of cycles of the second clock; and
a difference between the frame period and a cumulative time of the first number of cycles of the first clock and the second number of cycles of the second clock is less than a threshold value.

9. The clock generator of claim 8, further comprising a control circuit, the control circuit configured to:
monitor an output of the clock divider circuit;
determine that the difference between the frame period and the cumulative time of the first number of cycles of the first clock and the second number of cycles of the second clock is greater than the threshold value; and
adjust at least one of the first dividing ratio, the second dividing ratio, the first number of cycles of the first clock, or the second number of cycles of the second clock to reduce the difference between the frame period and the cumulative time of the first number of cycles of the first clock and the second number of cycles of the second clock.

10. The clock generator of claim 1, wherein a maximum time interval error between the target clock and an output of the clock divider circuit is less than a threshold value.

11. The clock generator of claim 10, wherein the threshold value is less than a clock period of the input clock.

12. The clock generator of claim 1, wherein the clock divider circuit is a clock counter.

13. A method of generating a target clock using a reference clock, the method comprising:
receiving the reference clock;
generating, during a first portion of a frame period, a first clock that is slower than the target clock by dividing the reference clock by a first dividing ratio; and
generating, during a second portion of the frame period, a second clock that is faster than the target clock by dividing the reference clock by a second dividing ratio,
wherein a first ratio between a frequency of the reference clock and a frequency of the target clock is a non-integer number.

14. The method of claim 13, wherein:
dividing the reference clock by the first dividing ratio during the first portion of the frame period generates a first number of cycles of the first clock;
dividing the reference clock by the second dividing ratio during the second portion of the frame period generates a second number of cycles of the second clock; and
a sum of the first number of cycles and the second number of cycles is equal to a number of cycles of the target clock in the frame period.

15. The method of claim 14, wherein the second number of cycles of the second clock are distributed among the first number of cycles of the first clock within the frame period.

16. The method of claim 13, wherein:
dividing the reference clock by the first dividing ratio during the first portion of the frame period generates a first number of cycles of the first clock;
dividing the reference clock by the second dividing ratio during the second portion of the frame period generates a second number of cycles of the second clock; and
a difference between the frame period and a cumulative time of the first number of cycles of the first clock and the second number of cycles of the second clock is less than a threshold value.

17. The method of claim 16, further comprising:
monitoring the generated clock;
determining that the difference between the frame period and a cumulative time of the first number of cycles of the first clock and the second number of cycles of the second clock is greater than a threshold value; and
adjusting at least one of the first dividing ratio, the second dividing ratio, the first number of cycles of the first clock, or the second number of cycles of the second clock to reduce the difference between the frame period and the cumulative time of the first number of cycles of the first clock and the second number of cycles of the second clock.

18. A circuit for generating a target clock, comprising:
a clock divider circuit configured to divide an input clock with a reconfigurable dividing ratio; and
a control circuit configured to:
set the reconfigurable dividing ratio of the clock divider circuit at a first dividing ratio during a first portion of a frame period to generate, by the clock divider circuit, a first number of cycles of a first clock that is slower than the target clock; and
set the reconfigurable dividing ratio of the clock divider circuit at a second dividing ratio during a second portion of the frame period to generate, by the clock divider circuit, a second number of cycles of a second clock that is faster than the target clock,
wherein a first ratio between a frequency of the input clock and a frequency of the target clock is a non-integer number.

19. The circuit of claim 18, wherein:
a difference between a number of cycles of the target clock in the frame period and a sum of the first number of cycles of the first clock and the second number of cycles of the second clock is less than a threshold value.

20. The circuit of claim 19, wherein the control circuit is further configured to:

monitor an output of the clock divider circuit;
determine that the difference is greater than the threshold value; and
adjust at least one of the first dividing ratio, the second dividing ratio, the first number of cycles of the first clock, or the second number of cycles of the second clock to reduce the difference.

\* \* \* \* \*